(12) United States Patent
Pludra et al.

(10) Patent No.: US 9,491,862 B2
(45) Date of Patent: Nov. 8, 2016

(54) METHOD FOR PRODUCING A PRINTED CIRCUIT BOARD CONSISTING OF AT LEAST TWO PRINTED CIRCUIT BOARD REGIONS, AND PRINTED CIRCUIT BOARD

(75) Inventors: Rainer Pludra, Eitorf (DE); Dietmar Drofenik, Spielberg (AT); Johannes Stahr, St. Lorenzen/Mürztal (AT); Siegfried Götzinger, Vienna (AT); Liubomir Mareljic, Rottenmann (AT)

(73) Assignee: AT & S AUSTRIA TECHNOLOGIE & SYSTEMTECHNIK AKTIENGESELLSCHAFT, Leoben-Hinterberg (AT)

( * ) Notice: Subject to any disclaimer, the term of this patent is extended or adjusted under 35 U.S.C. 154(b) by 271 days.

(21) Appl. No.: 13/383,237

(22) PCT Filed: Jul. 9, 2010

(86) PCT No.: PCT/AT2010/000254
§ 371 (c)(1),
(2), (4) Date: Jan. 10, 2012

(87) PCT Pub. No.: WO2011/003123
PCT Pub. Date: Jan. 13, 2011

(65) Prior Publication Data
US 2012/0275124 A1 Nov. 1, 2012

(30) Foreign Application Priority Data

Jul. 10, 2009 (AT) .................... 432/2009

(51) Int. Cl.
| | | |
|---|---|---|
| H05K 1/11 | (2006.01) | |
| H05K 1/14 | (2006.01) | |
| H05K 1/18 | (2006.01) | |
| H05K 3/36 | (2006.01) | |
| H05K 3/46 | (2006.01) | |
| H05K 3/22 | (2006.01) | |

(52) U.S. Cl.
CPC ............. H05K 1/142 (2013.01); H05K 1/185 (2013.01); H05K 3/368 (2013.01); H05K 3/4691 (2013.01);

(Continued)

(58) Field of Classification Search
CPC ...... H05K 1/141; H05K 1/142; H05K 1/144; H05K 1/145; H05K 1/18; H05K 1/181; H05K 1/182; H05K 1/183
USPC ................ 361/795, 736, 748, 749, 760, 792
See application file for complete search history.

(56) References Cited

U.S. PATENT DOCUMENTS

| | | |
|---|---|---|
| 3,952,231 A | 4/1976 | Davidson et al. |
| 2002/0020554 A1 | 2/2002 | Sakamoto et al. |

(Continued)

FOREIGN PATENT DOCUMENTS

| | | |
|---|---|---|
| CN | 1939104 A | 3/2007 |
| DE | 25 36 316 | 3/1976 |

(Continued)

OTHER PUBLICATIONS

International Search Report dated Nov. 4, 2010.

*Primary Examiner* — Tremesha S Willis
(74) *Attorney, Agent, or Firm* — Jacobson Holman, PLLC.

(57) ABSTRACT

In a method for producing a printed circuit board consisting of at least two printed circuit regions, wherein the printed circuit board regions each comprise at least one conductive layer and/or at least one device or one conductive component, wherein printed circuit board regions to be connected to one another, in the region of in each case at least one lateral surface directly adjoining one another, are connected to one another by a coupling or connection, and wherein, after a coupling or connection of printed circuit board regions, at least one additional layer or ply of the printed circuit board is applied over the printed circuit board regions, the additional layer is embodied as a conductive layer, which is contact-connected via plated-through holes to conductive layers or devices or components integrated in the printed circuit board regions.

9 Claims, 5 Drawing Sheets

(52) U.S. Cl.
CPC ............ *H05K 3/4694* (2013.01); *H05K 3/225* (2013.01); *H05K 2201/0187* (2013.01); *H05K 2201/09163* (2013.01); *H05K 2201/09845* (2013.01); *H05K 2203/1461* (2013.01); *Y10T 29/49155* (2015.01)

(56) References Cited

U.S. PATENT DOCUMENTS

| | | |
|---|---|---|
| 2007/0281505 A1 | 12/2007 | Kobayashi et al. |
| 2008/0099230 A1 | 5/2008 | Takahashi et al. |

FOREIGN PATENT DOCUMENTS

| | | |
|---|---|---|
| DE | 2536316 A1 | 3/1976 |
| DE | 93 09 973.8 | 10/1993 |
| EP | 1734580 A2 | 12/2006 |
| ES | 2168070 A1 | 5/2002 |
| FR | 2 284 190 | 4/1976 |
| JP | H11-317582 A | 11/1999 |
| JP | 2009-021425 A | 1/2009 |
| WO | 99/25163 | 5/1999 |
| WO | 2005/101928 | 10/2005 |

Fig. 15c

METHOD FOR PRODUCING A PRINTED CIRCUIT BOARD CONSISTING OF AT LEAST TWO PRINTED CIRCUIT BOARD REGIONS, AND PRINTED CIRCUIT BOARD

This is a national stage of PCT/AT2010/000254 filed Jul. 9, 2010 and published in German, which claims the priority of Austria number GM 432/2009 filed Jul. 10, 2009, hereby incorporated by reference.

FIELD OF THE INVENTION

The present invention relates to a method for producing a printed circuit board consisting of at least two printed circuit board regions, wherein the printed circuit board regions each comprise at least one conductive layer and/or at least one device or one conductive component, wherein printed circuit board regions to be connected to one another, in the region of in each case at least one lateral surface directly adjoining one another, are connected to one another by a coupling or connection, and wherein, after a coupling or connection of printed circuit board regions to be connected to one another, at least one additional layer or ply of the printed circuit board is arranged or applied over the printed circuit board regions to be connected to one another. The present invention, moreover, relates to a printed circuit board consisting of at least two printed circuit board regions, wherein the printed circuit board regions each comprise at least one conductive layer and/or at least one device or one conductive component, wherein printed circuit board regions to be connected to one another, in the region of in each case at least one lateral surface directly adjoining one another, are connectable or connected to one another by a coupling or connection, and wherein, on printed circuit board regions connected to one another, at least one additional layer or ply of the printed circuit board is arranged over the printed circuit board regions to be connected to one another.

PRIOR ART

In the context of the production of printed circuit boards, it has become more and more common practice to produce or assemble a printed circuit board of at least two, particularly separately produced, printed circuit board regions consisting of regions that are horizontally connected and frequently made of different materials, wherein such a mode of procedure, which is, for instance, known as modularization, is, for instance, applied because individual partial regions of a printed circuit board have to meet different demands. Thus, it is, for instance, known that in partial regions of a printed circuit board power electronics is integrated or incorporated, while in other regions of a printed circuit board digital technology is, in particular, applied. The production of a printed circuit board simultaneously comprising, for instance, power electronics and digital technology does not make sense in terms of both production expenditures and electrical and mechanical coupling designs, thus usually leading to elevated costs. In respect to an increasingly sought miniaturization of such printed circuit boards, different production techniques and methods which cannot be readily combined with one another are, moreover, applied to an increasing extent.

Finally, such a printed circuit board that is assembled by coupling superimposed layers of different materials, i.e. has a so-called hybrid structure or includes partial regions with integrated high-frequency or power electronics, usually comprises regions with different warm-up rates or different expansion coefficients such that, in practical usage, such a printed circuit board will frequently become warped or distorted, thus markedly reducing its service life and reliability.

For the production of printed circuit boards consisting of at least two, particularly differently constructed, printed circuit board regions, it is, for instance, known to arrange at least one module on a standard carrier or a printed circuit board region of an accordingly simple configuration in order to achieve the desired properties of different partial regions of such a printed circuit board. An embodiment of this type is, for instance, known from WO 99/25163, wherein, in a printed circuit board region or carrier of simplified design, recesses are provided in a manner corresponding to the modules to be fixed, said modules to be fixed covering the recesses so as to ensure in the edge region of the recesses bonding by contact pads correspondingly provided on the edge regions of the modules to be fixed thereto. A similar configuration can also be taken from ES-A 216870. It is immediately apparent that the production of printed circuit boards each comprising a plurality of printed circuit board regions usually having different structures and different functions, which are to be disposed one above the other or horizontally, is extremely expensive and difficult due to the usually provided large number of connections or the accordingly miniaturized configuration. In addition, that known prior art involves the drawback that the end product, besides a substantially full-surface printed circuit board region of usually simplified structure constituting a carrier, comprises a plurality of further printed circuit board regions projecting therefrom and connected therewith such that handling may involve additional problems, particularly on account of the existing irregular surface structures.

A similar mode of production of a printed circuit board having a plurality of printed circuit board regions can, for instance, also be taken from DE-U 93 09 973, wherein, again on a base circuit board, a printed circuit board region that is, in particular, provided with light-emitting devices, is contact-connected via contacts provided about edge or peripheral regions and projecting above respective recesses provided in the base circuit board.

An electric circuit arrangement in compact construction of the initially defined kind can, for instance, be further taken from DE-A 2536316 or FR-A 2284190, wherein electric coupling is realized on an outer side via power patterns and various elements can be inserted into the card, wherein it is, moreover, said that good heat dissipation properties are provided.

SUMMARY OF THE INVENTION

The present invention aims to further develop a method and a printed circuit board of the initially defined kind to the effect that the above-mentioned drawbacks will be avoided when using and assembling different printed circuit board regions, wherein it is additionally aimed to particularly provide a reliable connection and contacting as well as a simple production of individual printed circuit board regions and the integration thereof.

To solve these objects, a method of the initially defined kind is essentially characterized in that the additional layer is embodied as a conductive layer which is contact-connected via plated-through holes to conductive layers or devices or components integrated in the printed circuit board regions to be connected to one another. Since the printed circuit board regions to be connected to one another in the region of at least one lateral surface or edge are connected or coupled to one another by a coupling or connection, it will be ensured that the printed circuit board regions to be connected to one another will not mutually overlap but rather be substantially adjacently arranged. Such a connection in the region of at least one adjoining lateral surface will thus provide a substantially plane printed circuit board in which different partial regions that are, in particular, produced or provided separately in a modular manner in different production steps and fulfil accordingly different functions can be readily and reliably coupled or connected to each other. The method according to the invention thus enables the optimization of the production process of the individual printed circuit board regions, whereupon the latter can be connected or coupled to one another in a simple and reliable manner to provide a printed circuit board comprising different partial regions. The conductive layer additionally provided by the invention will subsequently enable the simple electrical contacting of the printed circuit board regions to be connected to one another, which will be realized via the plated-through holes provided by the invention with integrated layers and/or devices in the printed circuit board regions to be connected. In accordance with the invention, a sandwiched structure of the printed circuit board consisting of a plurality of printed circuit board regions will thus be made available, particularly by providing accordingly plane structures for the subsequent patterning of, e.g., conducting layers or for the subsequent mounting of components.

For contacting or patterning, it is proposed according to a preferred embodiment of the invention that, after having connected or coupled printed circuit board regions to be connected to one another and/or after having arranged or applied at least one additional conducting or conductive layer or ply, the structuring or patterning of conducing or conductive layers of the printed circuit boards and/or the mounting of additional electronic components or devices on the printed circuit board is/are effected.

Depending on the structure of the individual printed circuit board regions to be connected and, in particular, in order to ensure complete insulation relative to the conductive layer to be provided after connection, via which layer contacting is effected, it is proposed according to a further preferred embodiment that, prior to applying the additional conductive layer, an insulating or non-conductive layer is applied on the printed circuit board regions connected to one another.

In order to avoid partial regions having different heights, of the printed circuit board to be produced, it is proposed according to a further preferred embodiment that printed circuit board regions to be connected to one another are substantially arranged in a common plane and connected or coupled to one another.

For an additional electrical coupling or connection of the printed circuit board regions to be connected to one another, it is proposed according to a further preferred embodiment that an electrical connection of electrically conducting or conductive regions or elements of the printed circuit board regions to be connected to one another and/or layers of additional plies or additional elements is formed by soldering, gluing, welding, riveting or pinning, by vias or passages, conductively made bores, conductive pastes, conductive foils or wires, electronic devices or components or optical connections.

For the reliable coupling of individual printed circuit board regions to be connected to one another, it is proposed according to a further preferred embodiment that the coupling or connection of the printed circuit board regions to be connected to one another is effected by gluing, press-fitting, laminating, bonding, welding, soldering, a galvanic connection and/or by arranging or fixing components of the printed circuit board. These are methods that are generally known per se, and widely used, in the context of printed circuit board production processes such that the manipulation of individual printed circuit board regions and their connection for the production of a printed circuit board consisting of several printed circuit board regions can be performed in an accordingly simple manner.

To further improve or simplify the coupling or connecting of printed circuit board regions to be connected to one another, it is proposed according to a further preferred embodiment that at least one mutually complementary coupling element is each formed on mutually adjoining lateral surfaces of the printed circuit board regions to be connected to one another, via which coupling element coupling or connecting to the respectively adjoining printed circuit board region is effected. Such complementary coupling elements can be produced in an accordingly simple manner and, in particular, are able to improve the mechanical stability of the connection of individual printed circuit board regions.

To further support the coupling or connecting of printed circuit board regions to be connected to one another, it is, moreover, proposed in a preferred manner that complementary coupling elements are positively connected to each other.

For an optionally desired embedment of at least one printed circuit board region in a printed circuit board region to be connected thereto, it is, moreover, proposed that mutually adjoining lateral surfaces of printed circuit board regions to be connected to one another are formed with mutually complementary profilings, particularly in the form of stepped and/or through-going recesses or depressions, as in correspondence with a further preferred embodiment of the method according to the invention.

For the reliable incorporation or embedment of printed circuit board regions having, for instance, complex structures in a printed circuit board region forming a base of the printed circuit board, it is proposed according to a further preferred embodiment that the embedment of a printed circuit board region in an accordingly formed recess or depression of a printed circuit board region to be connected thereto is effected, wherein, in addition to in each case at least one mutually adjoining lateral surface of the printed circuit board regions to be connected to one another, an at least partial sheathing of the printed circuit board region to be received is additionally provided on a peripheral surface different from the lateral surface.

In order to, in particular, compensate for different thicknesses of printed circuit board regions having different structures, it is proposed according to a further preferred embodiment that recesses or depressions for receiving printed circuit board regions extend over several layers or plies of multilayer printed circuit board regions. This will, in particular, enable the adaptation of the thickness of a printed circuit board region of a usually more complex structure comprising a large number of plies to the thickness of a printed circuit board region having an accordingly simpler structure.

As already pointed out above, it is feasible by using the method according to the invention to connect or couple to one another, for the formation of a single or common printed circuit board, printed circuit board regions of the most diverse configurations and structures, wherein the printed circuit board regions to be connected to one another according to a further preferred embodiment are formed by flexible, rigid, rigid-flexible or semi-flexible printed circuit board regions and/or high-frequency, HDI, substrate or ceramic printed circuit board regions.

The production of rigid-flexible printed circuit boards, in particular, involves the problem that the rigid material, or rigid partial regions, of such a rigid-flexible printed circuit board exhibit good dimensional stabilities during processing steps, especially laminating steps, while the flexible material has a comparatively poor stability. Due to this instability of, in particular, the flexible material or flexible partial regions, a printed circuit board will possibly exhibit considerable deformations after relamination, which will subsequently lead to orientation problems if circuits, conducting elements or holes of small sizes are to be positioned on the flexible layers, particularly relative to the positions of corresponding circuits or conducting elements. In order to avoid misalignments, it is therefore common in the production of rigid-flexible circuit boards or production formats to use considerably smaller production formats than in the production or rigid circuit boards, such smaller production formats involving an increased amount of work and elevated costs.

In the context of the method according to the invention, it is proposed according to a further preferred embodiment for the production of rigid-flexible circuit boards, considering the advantages achievable by the method according to the invention when coupling or connecting different printed circuit board regions, that for the production of a rigid-flexible printed circuit board a flexible printed circuit board region is formed with at least one adjoining transition region of rigid material, and the transition region(s) of rigid material is/are coupled or connected to (at least one) rigid printed circuit board region(s) of the rigid-flexible printed circuit board to be produced. Due to the fact that a flexible printed circuit board region is formed with at least one adjoining transition region of rigid material and, after this, the at least one transition region of rigid material is coupled to at least one further rigid printed circuit board region, it has become possible to make the flexible partial regions small with, as the case may be, an accordingly poorer dimensional stability and, by simultaneously providing the at least one rigid transition region, provide a reliable coupling to the separately produced, rigid printed circuit board regions in order to produce the desired rigid-flexible printed circuit board. Taking into account the existing dimensional stability, an accordingly precise positioning of holes, vias or arrangement of circuit elements can be performed on the separately produced, rigid printed circuit board regions, wherein the flexible partial region of a usually smaller dimensional stability is connected to the rigid printed circuit board regions in a subsequent operating step via the coupling between the rigid transition region. Due to the separate production of the flexible printed circuit board region with at least one adjoining transition region usually having relatively small dimensions and made of rigid material and the rigid printed circuit board regions, it has, moreover, become possible that usually more expensive, flexible printed circuit board materials are to be used in a manner accordingly optimized relative to the actual dimensions of the flexible partial region to be produced, so that additional respective cost advantages will be achievable in the production of rigid-flexible printed circuit boards. It is, moreover, possible to connect the separately produced, flexible partial regions with the adjoining at least one transition region of rigid material as well as the rigid printed circuit board regions to be connected or coupled thereto by using a largely automated assembly method such that, in particular, restrictions according to the known prior art in respect to small production formats can likewise be minimized or completely eliminated in the production of rigid-flexible printed circuit boards.

To further improve the exploitation of, in particular, the more expensive, flexible material in the production of a rigid-flexible printed circuit board, it is proposed according to a further preferred embodiment that a flexible printed circuit board region with at least one adjoining transition region is cut out of a carrier element comprising a plurality of such flexible printed circuit board regions and is inserted in a respective recess of a carrier element likewise comprising a plurality of rigid printed circuit board regions for the coupling or connection with the at least one rigid printed circuit board region to be connected thereto. By an accordingly better exploitation of the, in particular, flexible material, it is thus possible to produce in separate operating steps the flexible partial regions usually having small dimensions for a plurality of rigid-flexible printed circuit boards to be produced, whereupon a simple and reliable connection to likewise separately produced printed circuit board regions of rigid material and of, for instance, elevated dimensional stability can be performed.

The connection between, in particular, the at least one rigid transition region and the adjoining, rigid printed circuit board regions can be performed according to one of the above-mentioned methods.

To solve the initially mentioned objects, a printed circuit board of the above-identified type is, moreover, substantially characterized in that the additional layer is formed as a conductive layer, and that plated-through holes are formed or provided between the additional conductive layer and in the conductive layers or devices or components integrated in the printed circuit board regions to be connected. As already pointed out above, a printed circuit board produced or assembled of several printed circuit board regions is thus provided in a simple and reliable manner, said printed circuit board, in particular, enabling the reliable electrical contacting of the printed circuit board regions to be connected to one another.

In order to achieve the contact-connection of the individual printed circuit board regions, particularly in accordance with predetermined circuit patterns, it is proposed according to a preferred embodiment that the additional conductive layer is designed to be patterned and/or mounted with additional electronic devices or components.

Depending on the structure of the individual printed circuit board regions to be connected and, in particular, in order to ensure complete insulation relative to the conductive layer to be provided after connecting, via which conductive layer contacting is effected, it is proposed according to a further preferred embodiment that printed circuit board regions to be connected to one another are substantially arranged in a common plane and connectable or coupleable to one another.

In order to provide an accordingly plane structure or avoid excessive elevations of individual modules or printed circuit board regions, it is, moreover, proposed in a preferred manner that printed circuit board regions to be connected to one another are substantially arranged in a common plane and connectable or coupleable to one another.

For an additional and reliable electrical connection, it is, moreover, proposed that an electrical connection of electrically conducting or conductive regions or elements of the printed circuit board regions to be connected to one another and/or layers of additional plies or additional elements is formed by soldering, gluing, welding, riveting or pinning, by vias or passages, conductively made bores, conductive pastes, conductive foils or wires, electronic devices or components or optical connections, as in correspondence with a further preferred embodiment of the printed circuit board according to the invention.

In a preferred manner, and in order to ensure proper connecting or coupling, it is proposed according to a preferred embodiment that coupling or connecting of the printed circuit board regions to be connected to one another is effected by gluing, press-fitting, laminating, bonding, welding, soldering, a galvanic connection and/or by arranging or fixing components of the printed circuit board.

In order to provide a reliable coupling as already indicated above, it is, moreover, proposed in a preferred manner that at least one mutually complementary coupling element is each formed on mutually adjoining lateral surfaces of the printed circuit board regions to be connected to one another, via which coupling element a coupling or connection to the respectively adjoining printed circuit board region is feasible. According to a particularly preferred embodiment, it is additionally proposed in this respect that mutually complementary coupling elements are positively connectable to each other.

For the reliable incorporation of printed circuit board regions to be connected to one another, it is, moreover, proposed in a preferred manner that mutually adjoining lateral surfaces of printed circuit board regions to be connected to one another are formed with mutually complementary profilings, particularly in the form of stepped and/or through-going recesses or depressions.

For the embedment of printed circuit board regions having, in particular, more complex structures in a printed circuit board region forming a carrier and optionally having a simpler structure, it is, moreover, proposed that a printed circuit board region is receivable in an accordingly formed recess or depression of a printed circuit board region to be connected thereto, wherein, in addition to in each case at least one mutually adjoining lateral surface of the printed circuit board regions to be connected to one another, a sheathing of the printed circuit board region to be received is additionally provided on a peripheral surface different from the lateral surface, as in correspondence with a further preferred embodiment of the printed circuit board according to the invention.

For the compensation of possibly different thicknesses of such printed circuit board regions to be connected to one another, it is, moreover, proposed in a preferred manner that recesses or depressions for receiving printed circuit board regions extend over several layers or plies of multilayer printed circuit board regions.

As already pointed out above, it is feasible to interconnect or couple different configurations of printed circuit board regions according to the present invention, wherein, in this respect, it is proposed according to a further preferred embodiment that the printed circuit board regions to be connected to one another are formed by flexible, rigid, rigid-flexible or semi-flexible printed circuit board regions and/or high-frequency, HDI, substrate or ceramic printed circuit board regions.

In particular, in the context of the production of rigid-flexible printed circuit boards, it is proposed according to a further preferred embodiment that, for a rigid-flexible printed circuit board, a flexible printed circuit board region is formed with at least one adjoining transition region of rigid material, and the transition region(s) of rigid material is/are coupled or connected to (at least one) rigid printed circuit board region(s) of the rigid-flexible printed circuit board to be produced. In this manner, it has become possible to produce rigid-flexible printed circuit boards in a simple and reliable and also accordingly cost-effective manner, as already discussed in detail above.

In accordance with the method of the invention, and by providing the printed circuit board according to the invention, it has thus become feasible to produce as small as possible accordingly complex partial regions including, for instance, a digital or flexible region of a printed circuit board, and to integrate the same in a printed circuit board region of accordingly simpler structure. Such printed circuit board regions can each be miniaturized so as to enable accordingly low costs and optimized production methods for individual printed circuit board regions having, in particular, complex structures. It is, furthermore, possible to accommodate or embed such highly complex modules or printed circuit board regions in a printed circuit board region constituting a carrier, for instance, as a function of standard dimensions to be met by the finished printed circuit board for further use or for an installation in suitable equipment.

In addition, the method according to the invention as well as the provision of the printed circuit board according to the invention allow for simplified electrical contacting, wherein, by separating partial regions having different structures and different purposes of use, also mutual influences, e.g., of high frequency and digital technologies, will be avoided. It is, in particular, possible to obtain a reduction of the surface area required for individual partial regions, and to improve the flexibility both in the construction of printed circuit boards meeting different demands and in the assemblage of individual printed circuit board regions.

The coupling proposed by the invention in the region of at least one mutually adjoining lateral surface or edge, in addition, allows for the provision of a reliable and simplified, both mechanical and electrical, connection as compared to the known prior art, where, in particular, recesses of modules covering printed circuit boards or printed circuit board carriers require complex contacting or bonding procedures. Furthermore, an electrical connection of the individual printed circuit board regions can, moreover, be established by the arrangement of the additional conductive layer and the plated-through holes, as already mentioned above.

Particularly when embedding a printed circuit board region in a corresponding recess or depression of a further printed circuit board region having, for instance, a simplified structure, soldering for connecting individual printed circuit board regions can be renounced. Such embedment can, for instance, be realized by gluing or casting, whereby, after an accordingly simple connection or coupling, also an, optionally required, simplified insertion of further components will be enabled.

The method according to the invention and the printed circuit board produced according to the invention, furthermore, make available to a user printed circuit boards that have integrated all functions due to the connection or coupling as well as contacting of individual printed circuit board regions, so that no complex connection by the application or fixation of separately produced printed circuit board regions or modules will, for instance, be required on the user or customer side.

SHORT DESCRIPTION OF THE DRAWINGS

In the following, the invention will be explained in more detail by way of exemplary embodiments schematically illustrated in the accompanying drawing. Therein:

FIG. 2 shows a section through a modified embodiment of a printed circuit board according to the invention in an illustration similar to that of FIG. 1, FIG. 2a additionally indicating a printed circuit board region (16') to be replaced;

FIG. 15 depicts schematic views of method steps of the production of a rigid-flexible printed circuit board according to the invention using the method of the invention, FIG. 15a indicating the production of flexible printed circuit board regions with at least on adjoining transition region, FIG. 15b indicating the separate production of rigid printed circuit board regions to be connected to the flexible printed circuit board regions produced according to FIG. 15a, and FIG. 15c indicating the removal of flexible printed circuit board regions on the production format according to FIG. 15a and their insertion into the production format according to FIG. 15b comprising rigid printed circuit board regions.

DETAILED DESCRIPTION OF PREFERRED EMBODIMENTS

Figure 1:
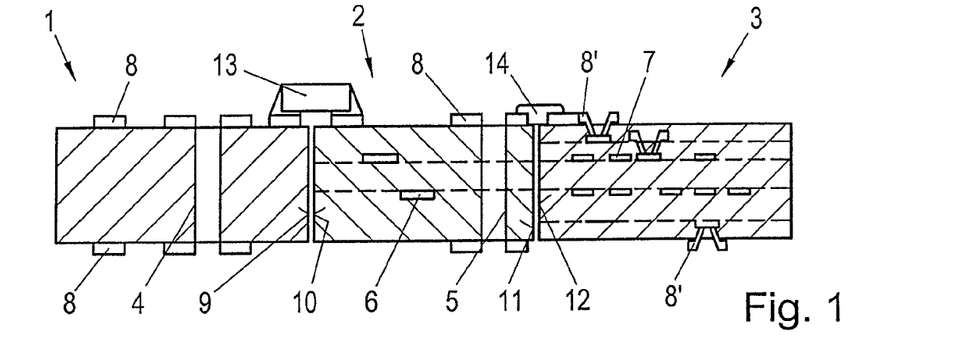
FIG. 1 shows a schematic section through a first embodiment of a printed circuit board according to the invention, which is produced by the method according to the invention.

In FIG. 1, three printed circuit board regions 1, 2 and 3 to be connected to one another are schematically illustrated, the different setups or structures being schematically indicated by the use of different numbers of layers or plies. In addition, schematically indicated structures such as passages or vias 4 and 5 as well as components or elements 6 and 7 integrated in the individual layers or plies are provided in the printed circuit board regions 1, 2 and 3. Moreover, patterns of conductive structures 8 are, in particular, indicated on the surfaces of the individual printed circuit board regions, said structures 8 being formed in a conductive layer applied after the connecting or coupling of the printed circuit board regions 1, 2 and 3.

In the region of respectively adjoining lateral surfaces 9 and 10 as well as 11 and 12 of the printed circuit board regions 1, 2 and 3 to be connected to one another, a mechanical connection of the printed circuit board regions 1, 2 and 3 is effected in addition to an electric coupling or connection, for instance by gluing or soldering of the individual printed circuit board regions, as is additionally indicated beside the structures or patterns 8 of the conductive layer, for instance, by means of a device 13 for coupling between the printed circuit board regions 1 and 2 and, for instance, provided in the form of a printed connection 14 for connecting printed circuit board regions 2 and 3.

In addition, plated-through holes 8' are apparent both from the structures 8 on the upper side of the printed circuit board regions 1, 2 and 3 to be connected to one another and on the lower side, structures 8 of a further conductive layer being also indicated.

The printed circuit board region 1 can, for instance, be formed by a simple printed circuit board element or region, which is patterned on both sides. By contrast, the printed circuit board region 2 can, for instance, be a multilayer high-frequency printed circuit board region, which is in turn coupled to the multilayer digital printed circuit board region 3.

The individual printed circuit board regions 1, 2 and 3 can be separately produced in accordingly optimized production processes, after which they are combined with one another to form a printed circuit board fulfilling a plurality of different functions.

Instead of the connection indicated in FIG. 1, between the individual printed circuit board regions 1, 2 and 3, the connections depicted in the following Figures and comprising partially complementary or positive profilings can also be used.

Figures 2, 2A:
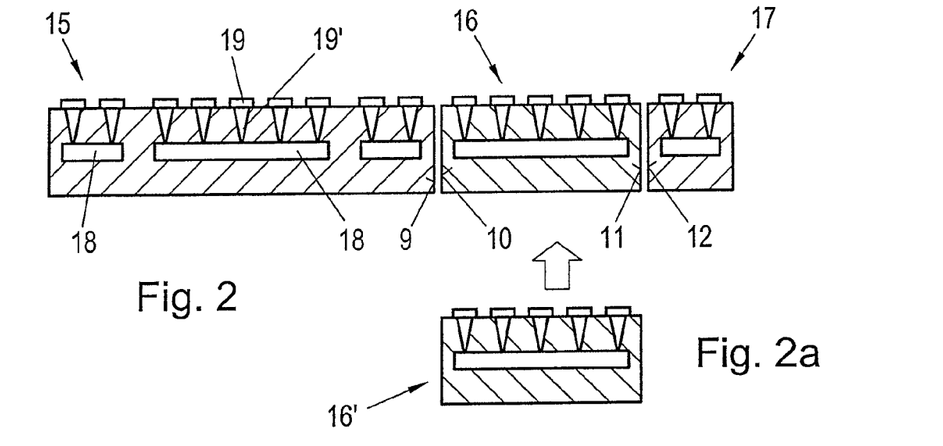

FIG. 2, in a manner similar to the illustration according to FIG. 1, depicts a modified embodiment of a printed circuit board again consisting of a plurality of printed circuit board regions 15, 16 and 17, wherein it is again apparent that the individual printed circuit board regions 15, 16 and 17 have different structures and/or complexities.

In the printed circuit board region 15, passive components 18 are, for instance, included. By 19, patterns of a conductive layer applied after connecting the printed circuit board regions 15, 16 and 17 are again indicated, wherein plated-through holes or through-hole paths to layers arranged therebelow and/or components 18 are indicated by 19'.

Mechanical connecting or coupling in the region of the mutually adjoining lateral surfaces or edges again denoted by 9 and 10 and 11 and 12, respectively, is again performed as in the preceding embodiment.

FIG. 2, in addition, schematically indicates that, for instance, at the occurrence of an error of the printed circuit board region 16, e.g. after an extended use of these printed circuit board regions 16, a separation is again effected in the region of the mutually adjoining lateral surfaces 9, 10 and 11, 12, for instance by using a laser, whereupon a new functional printed circuit board region 16 can again be connected to the printed circuit board regions 15 and 17. In this manner, highly complex and accordingly expensive printed circuit board regions can, for instance, be replaced, thus avoiding an exchange of the whole printed circuit board.

Figure 3:
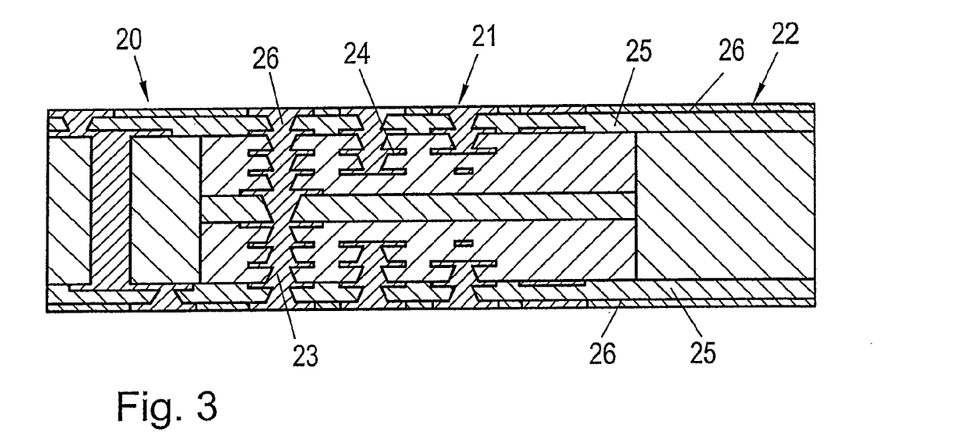
FIG. 3 shows a section through a further modified embodiment of a printed circuit board according to the invention, wherein printed circuit board regions connected to one another are covered by the arrangement of additional layers or structures.

From FIG. 3, a further schematic illustration of a printed circuit board produced of printed circuit board regions 20, 21 and 22 is apparent, wherein, besides the simple structures of the printed circuit board regions 20 and 22, the central printed circuit board region 21 comprises a highly complex structure as indicated by a plurality of through-hole paths or vias 23. The multilayer structure of the printed circuit board region 21 is indicated by additional patterns 24 made of, in particular, conductive material and provided on different levels or plies.

From FIG. 3, it is moreover apparent that, after connecting or coupling of the printed circuit board regions 20, 21 and to be connected to one another, additional layers or plies 25, 26 of a multilayer printed circuit board are applied, particularly on both sides, so that the printed circuit board regions 20, 21 and 22 connected to one another are substantially fully integrated or incorporated in a thus completed printed circuit board.

The contacting of individual partial regions of the printed circuit board regions 20, 21 and 22, or of inwardly disposed conductive structures 24, is realized via plated-through holes 23 which are connected to patterns of the conductive layer 26 after having penetrated the insulating or non-conductive layer 25.

Figure 4:
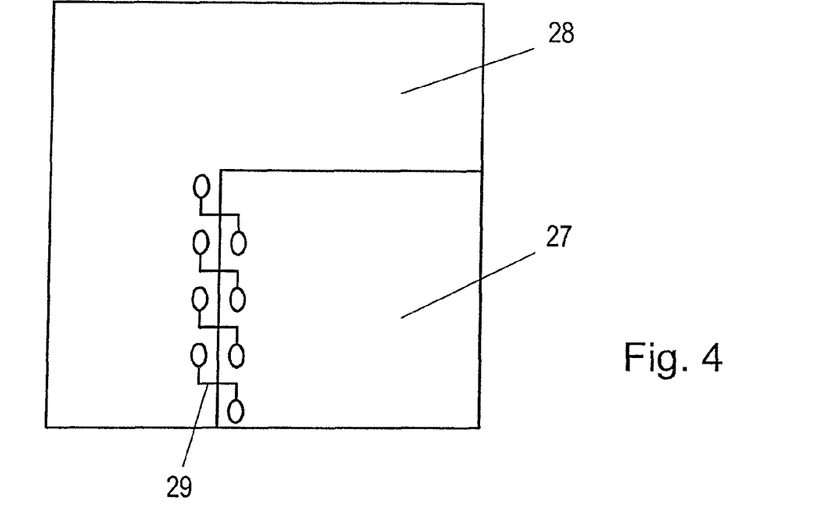
FIG. 4 is a top view of a further modified embodiment of a printed circuit board according to the invention, with the arrangement and connection of different printed circuit board regions being indicated.
Figure 5:
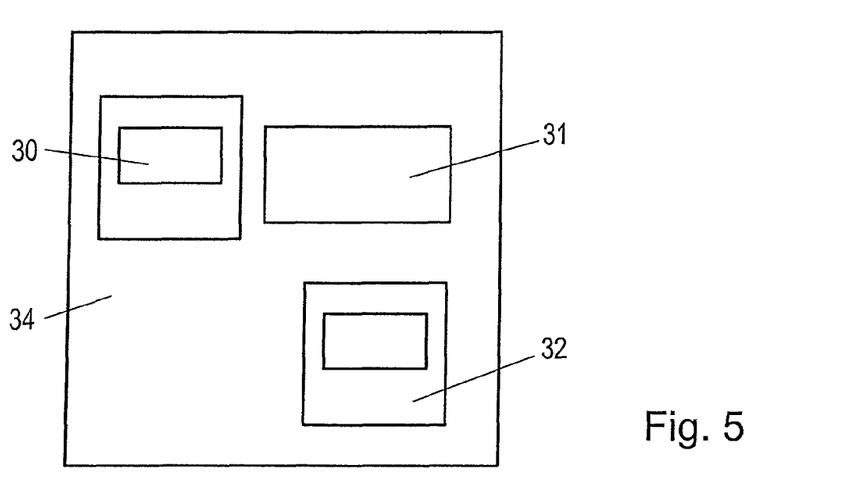
FIG. 5, in an illustration similar to that of FIG. 4, depicts a further modified embodiment of a printed circuit board according to the invention including a plurality of printed circuit board regions connected or coupled to one another.

From the schematic top views of FIGS. 4 and 5, it is apparent that printed circuit board regions to be connected, unlike in the embodiments particularly illustrated in FIGS. 1, 2 and 3, where adjacently located printed circuit board regions are connected to each other, are correspondingly inserted in partial regions of a base carrier so as to enable a connection of such printed circuit board regions not only on a lateral surface or side edge.

In the illustration according to FIG. 4, a printed circuit board region 27 having, for instance, substantially square outer dimensions is connected or coupled to a printed circuit board region 28 comprising a corresponding recess.

Besides a mechanical connection or coupling as already indicated above and subsequently explained in more detail, the embodiment illustrated in FIG. 4, for instance, additionally comprises wires 29 for the electric coupling of individual regions. Instead of using wires 29, a connection of conducting or conductive regions (not illustrated) of the individual partial regions 27 and 28 can also be realized by appropriate connectors or plugs, or by bonding.

From the illustration according to FIG. 5, it is apparent that different printed circuit board regions 30, 31 and 32 are integrated or received in printed circuit board regions 34 optionally having simpler setups such that the printed circuit board regions 30, 31 and 32 are each connected to the surrounding printed circuit board region 34 substantially relative to their entire peripheries.

Figure 6:
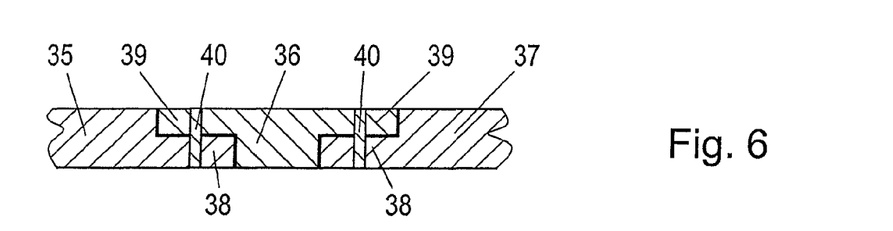
FIG. 6 is a schematic section through a partial region of a further modified embodiment of a printed circuit board according to the invention, wherein mutually complementary profilings for connecting or coupling the printed circuit board regions to be connected to one another are indicated.

FIG. 6 schematically indicates a connection between printed circuit board regions 35, 36 and 37, wherein, for instance, contrary to the embodiments illustrated in FIGS. 1, 2 and 3, in which substantially plane lateral surfaces are provided in an adjacent manner, the mutually adjoining lateral surfaces are formed with coupling elements or profilings 38 and 39 which, in the illustration according to FIG. 6, result in a substantially stepped structure.

In addition to an accordingly simplified mechanical coupling via step-like complementary profilings 38 and 39, of the printed circuit board regions 35, 36 and 37 to be connected to one another, the electrical contacting of individual partial regions, in the region of these partially overlapping coupling elements 38 and 39, can also be directly effected, for instance by providing conductive bores or vias or appropriate through-hole paths or plated-through holes, as is schematically indicated by 40. Besides such electrical contacting 40, mechanical connections formed, for instance, by rivets or pins, may further be provided.

Figure 7:
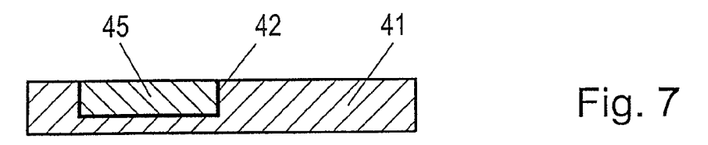
FIGS. 7, 8 and 9 depict further schematic sectional views of connections of printed circuit board regions of printed circuit boards according to the invention, with a printed circuit board region being each received or embedded in a respective recess or depression of another printed circuit board region.
Figure 8:
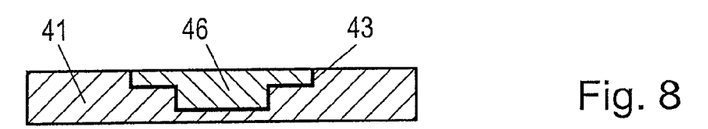
Figure 9:
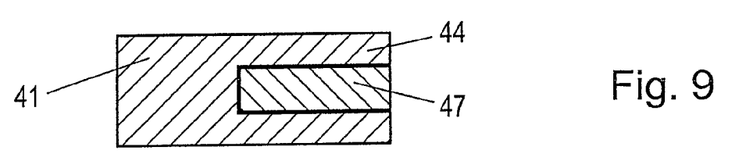

FIGS. 7, 8 and 9, furthermore, depict schematic embodiments of connections of printed circuit board regions, wherein a recess or depression 42, 43 and 44, respectively, is each provided in a printed circuit board region 41 optionally having a simple structure. Printed circuit board regions 45, 46 and 47 of, in particular, appropriate outer dimensions are inserted in the recesses or depressions, 42, 43 and 44, respectively, so as to ensure the embedment, and hence accordingly secured fixation, of the individual printed circuit board regions 45, 46 and 47 by the arrangement or fixation of the printed circuit board regions 45, 46 and 47 in the recesses or cavities or hollow spaces of the printed circuit board region 41.

The fixation in such recesses or depressions 42, 43, 44 can, for instance, be effected by gluing or simple press-fitting. Concerning electrical contacting options, it is referred to the preceding embodiments.

In this manner, highly complex printed circuit board regions 45, 46, 47 optionally having small dimensions can, in particular, be inserted in printed circuit board regions 41 optionally having simpler structures.

Figure 10:
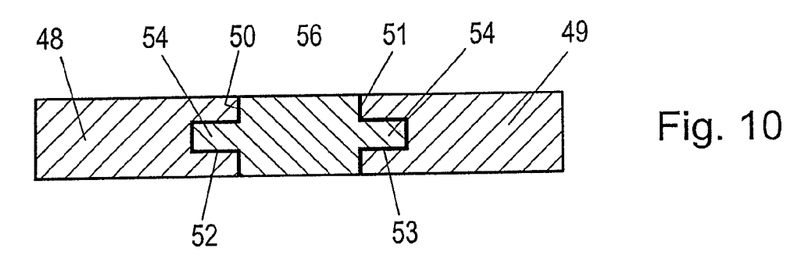
FIG. 10 illustrates a further modified embodiment of, in particular, mutually complementary profilings or coupling elements of printed circuit board regions to be connected to one another, of a printed circuit board according to the invention.
Figure 11:
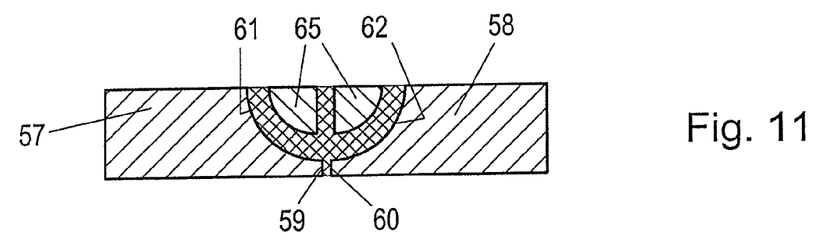
FIGS. 11 and 12 are further schematic illustrations of connection regions, or coupling elements disposed therein, of printed circuit board regions to be connected to one another, of printed circuit boards according to the invention.
Figure 12:
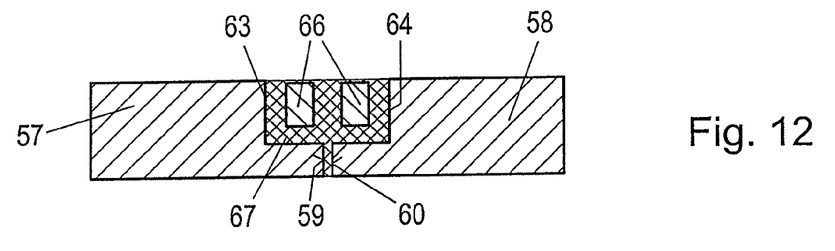

In FIGS. 10, 11 and 12, further modified embodiments of a particularly mechanical connection between printed circuit board regions to be connected to one another are illustrated.

In the embodiment according to FIG. 10, respectively outwardly disposed printed circuit board regions 48 and 49, in the region of the mutually adjoining lateral surfaces 50 and 51, each comprise an incision or depression 52, 53, in which the respective projections 54 and 55 of a central printed circuit board region 56 to be coupled thereto are readily coupleable. Such complementary depressions or recesses 52, 53 and projections 54, 55 are, in particular, able to provide an accordingly safe mechanical connection between the individual printed circuit board regions.

Further modified embodiments are illustrated in FIGS. 11 and 12, wherein additional recesses or depressions 61 and 62 or 63 and 64, respectively, are provided or indicated in the region of the lateral surface 59 and 60 to be connected, between schematically indicated printed circuit board regions 57 and 58, wherein, in order to ensure proper mechanical coupling, additional coupling elements 65 and 66 are respectively provided, which, for instance by an adhesive 67 schematically indicated in the region of the connection site, will result in a proper connection of the mutually adjoining printed circuit board regions 57 and 58 to be connected to one another.

For the sake of simplicity of the illustrations, FIGS. 4 to 12, which basically relate to different connections, do not show the conductive material layer to be additionally applied after having connected the printed circuit board regions, nor do they indicate the required plated-through holes except for FIG. 6.

Figure 13:
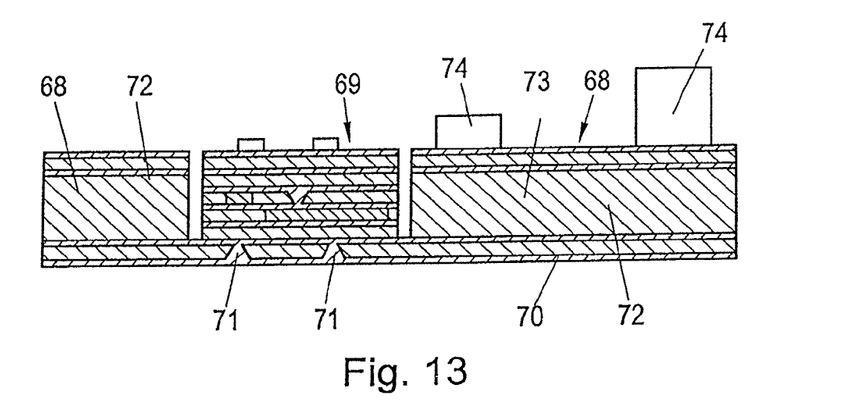
FIG. 13 illustrates a section through a further modified embodiment of a printed circuit board according to the invention, in which a replaced printed circuit board region is integrated.

FIG. 13 depicts a further modified embodiment, in which a printed circuit board region has been removed from a completed printed circuit board 68, e.g. after an extended period of use or a failure of a printed circuit board region, for instance by partially separating the printed circuit board 68 by the aid of a laser, and after this a new functional printed circuit board region 69 has been inserted, with a plurality of non-conducting layers of larger thicknesses and accordingly thinner conducting layers being indicated. The conductive structure or layer 70 of the printed circuit board 68 was not severed to replace the, for instance, defect printed circuit board region, and the new functional printed circuit board region 69 was inserted in place of the removed printed circuit board region, the contacts or plated-through holes 71 in the region of the conductive structure 70 having been maintained unchanged. Such a replaced printed circuit board region 69 will subsequently be again connected with the remaining printed circuit board regions 72 and 73 of the printed circuit board 68 by gluing, laminating, bonding or the like. With such a use, an accordingly complex and expensive defect printed circuit board region can, for instance, be replaced with an identical or even modified printed circuit board region 69 such that the complete substitution of the entire circuit board can be renounced.

Finally, all other elements of the original printed circuit board 68 such as devices 74 and contacts 71 can be retained.

Figure 14:
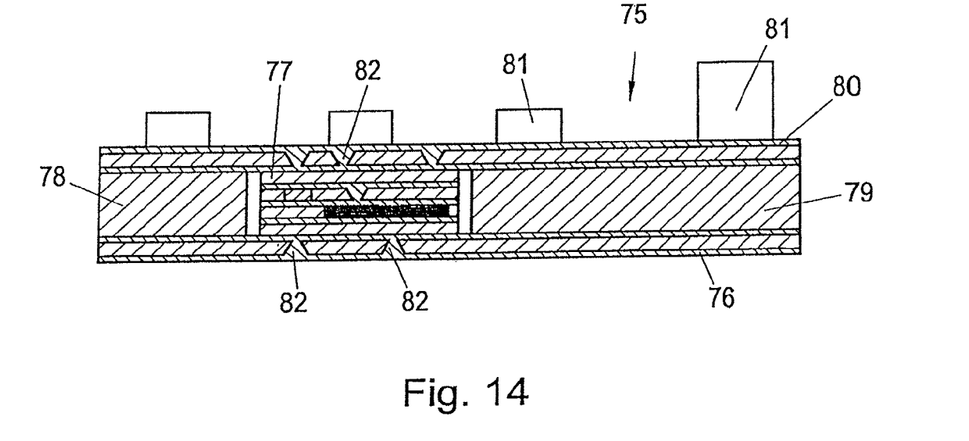
FIG. 14 shows a printed circuit board according to FIG. 13, in which interconnected printed circuit board regions are additionally connected by the arrangement of a conductive structure.

FIG. 14 depicts a modified variant of the substitution for a printed circuit board region, in which, for instance, a defect printed circuit board region has again been removed from a printed circuit board 75, wherein, as pointed out in connection with FIG. 13, a conductive structure 76 covering the entire circuit board 75 was not severed when removing the printed circuit board region. After having inserted a new printed circuit board region 77 into the printed circuit board 75 and connected this printed circuit board region with the printed circuit board regions 78 and 79 of the printed circuit board 75 by bonding, gluing, soldering or the like, an additional conductive structure 80 is applied either over the entire printed circuit board 75 rendered functional again or, e.g., only on the new printed circuit board region 77, so that the entire circuit board 75 will be covered by the additional conductive layer or structure 80. This conductive region 80 is additionally provided with devices 81. Similarly as with the configuration according to FIG. 13, the contacts or plated-through holes 82 provided in the region of the conductive structure 76 in this variant can, in particular, be maintained unchanged, thus enabling a particularly rapid and cost-effective replacement of a defect printed circuit board region. Appropriate feedthroughs 82 are also provided in the conductive layer or structure 80 disposed on the upper surface.

For the printed circuit board regions schematically illustrated in the preceding Figures, different circuit board elements can be used as already indicated, the latter being, for instance, comprised of high-frequency parts, HDI circuit boards, substrate circuit boards, flexible, rigid-flexible or semi-flexible circuit board regions or, optionally, ceramic circuit board regions.

To produce recesses or free spaces for receiving printed circuit board regions as are, for instance, apparent from the illustrations according to FIGS. 4 and 5, milling, punching, laser or water jet cutting, plasma etching or the like may, for instance, be applied. By appropriate milling or punching or cutting, mutually adjoining lateral surfaces or edges can be formed with matching profiles, e.g. in the form of steps as illustrated in FIG. 6.

The recesses or depressions illustrated in FIGS. 7, 8 and 9 can, for instance, be provided by pressing, imprinting or by clearing the respective recesses or depressions.

In addition to the above-mentioned options of providing a mechanical connection by gluing or press-fitting, a mechanical connection between the printed circuit board regions to be connected to one another may also be effected by laminating, soldering or a galvanic connection. Furthermore, a connection can be made by ultrasonic welding, laser welding or riveting or pinning as already indicated with reference to FIG. 6.

An electrical connection between the individual conducting or conductive regions of the printed circuit board regions to be connected to one another, in addition to the formation of through-hole paths or plated-through holes, conducting bores or vias as already indicated above, can be realized by arranging components or devices bridging the printed circuit board regions to be connected to one another, by gluing, e.g. by using an anisotropic adhesive or adhesive tape, by welding, again by riveting or pinning, by an optical connection of by the aid of conductive pastes and/or foils. Such conductive dyes or inks can be applied by printing methods.

Instead of the substantially complete sheathing or embedment illustrated in FIGS. 7, 8 and 9, of the printed circuit board regions 45, 46 and 47 to be incorporated, hollow spaces may also be left in the region of the recesses 42, 43 or 44 after the incorporation or insertion of the printed circuit board regions 45, 46 and 47 to be incorporated.

Figure 15A:
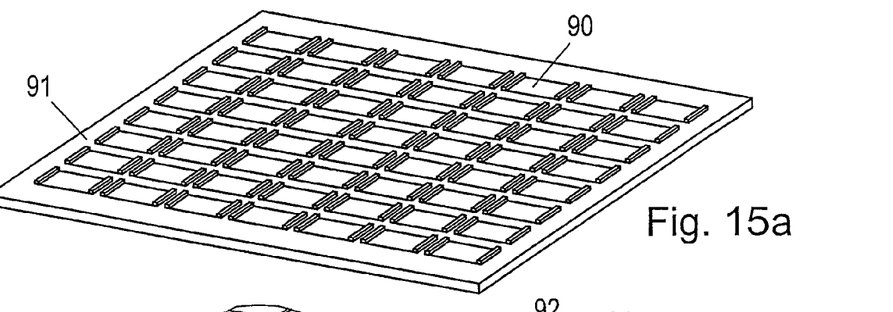

From the illustration according to FIG. 15a of a further modified embodiment, it is apparent that a plurality of flexible printed circuit board regions denoted by 90 are incorporated in a common carrier element 91 and processed within the same according to known method steps for the production of printed circuit boards, wherein FIG. 15a shows that a comparatively large production format or carrier element 91 is used as compared to known embodiments. From FIG. 15a, it is, moreover, apparent that the usually more expensive, flexible material used for the production of the flexible partial regions 90 can be utilized in an accordingly optimized manner, since in the method step represented in FIG. 15a a large number of in each case flexible partial regions 90 are produced at small mutual distances, over which also the flexible circuit board material extends.

Figure 15B:
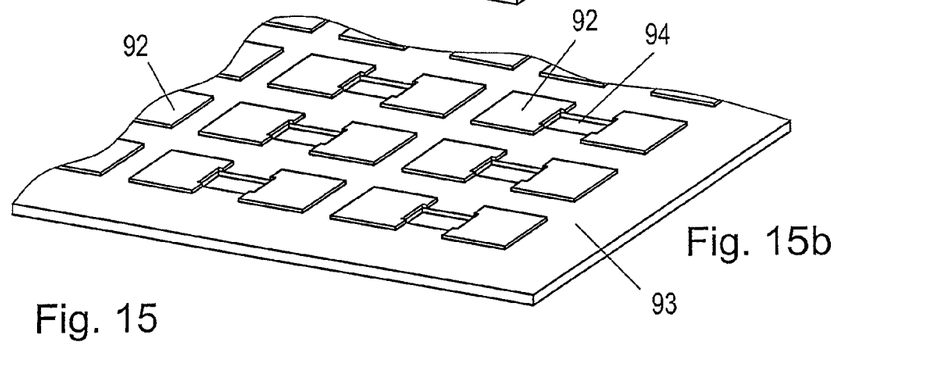

Similarly, and as illustrated in FIG. 15b, a plurality of rigid printed circuit board regions 92 are produced in a separate production method, said plurality of rigid printed circuit board regions 92 being received in a carrier element denoted by 93. In the region of the flexible partial regions 90 to be subsequently inserted, as illustrated in detail in FIG. 15c, free spaces or intervals 94 are each provided between subsequently cooperating rigid printed circuit board regions 92. The rigid printed circuit board regions 92 are likewise processed and produced according to production processes known for the formation of, in particular, multilayer printed circuit boards.

Figure 15C:
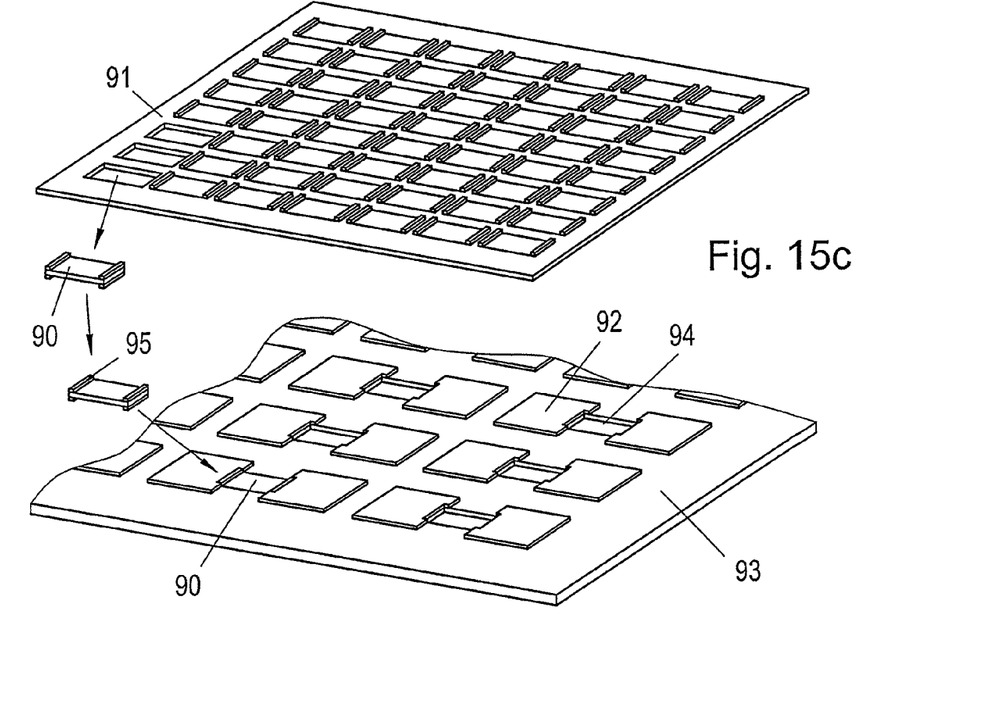

From the illustration according to FIG. 15c, it is apparent that after having completed the flexible printed circuit board regions 90 the latter are removed from the carrier element 91, for instance by separation methods known per se, wherein it is apparent from the illustration according to FIG. 15c that each of the flexible elements comprises a transition region 95 of rigid material, whereby coupling with the rigid printed circuit board regions 92 is performed by the aid of said transition region 95 during insertion into the free spaces 94.

Figure 16:
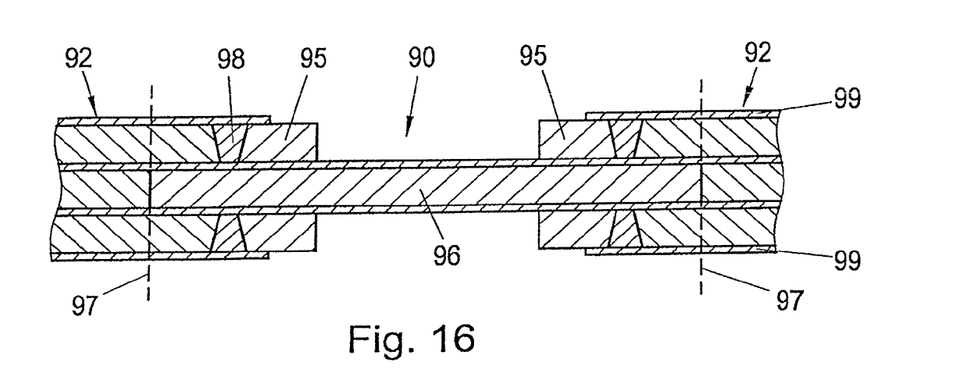
FIG. 16, on an enlarged scale, illustrates a partial section through a rigid-flexible printed circuit board as produced according to the embodiment of FIG. 15.

The coupling of the individual partial regions 90 and 92 is schematically illustrated in FIG. 16, from which it is apparent that the flexible partial region 90 comprises a flexible material region schematically denoted by 96, which is followed by the transition regions again denoted by 95.

In the region of the separation line 97 indicated in broken lines, coupling occurs between the transition regions 95 and the rigid partial regions 92 following thereupon. In the illustration according to FIG. 16, electrical couplings 98 are, moreover, indicated, via which direct coupling between conductive elements of the flexible material 96 and the consecutively arranged rigid regions 95 as well as 92 by the aid of a conductive layer 99 disposed in the region of the separation line 97 after coupling or connecting is thus effected. An insulating or non-conductive layer may be provided below the conductive layer 99 as a function of the structure of the printed circuit board regions 92 and 95 to be connected.

From the illustration according to FIG. 16, it is, moreover, apparent that the more expensive, flexible printed circuit board material 96 actually extends substantially only over the flexible partial region 90 and in the immediately adjoining transition regions 95, while the flexible circuit board material, unlike in known embodiments according to the prior art, is not present in the adjoining, rigid regions 92.

The schematically indicated coupling or connection in the region of the separation line 97 in this case is realized according to the connections discussed in detail in the preceding exemplary embodiments, in the region of mutually adjoining surfaces or end faces of printed circuit board regions to be connected to one another.

The invention claimed is:

1. A method for producing a printed circuit board comprising the following steps in the following order:
   providing two printed circuit board regions each comprising horizontal surfaces and vertical surfaces, wherein the printed circuit board regions each comprise at least one conductive layer and/or at least one device or one conductive component;
   placing the printed circuit board regions on a common plane that is parallel to the horizontal surfaces of the printed circuit board regions and directly adjoining the printed circuit board regions by a coupling or connection;
   applying a common insulating or nonconductive layer on the printed circuit board regions connected to one another; and
   applying at least one common further conductive layer on the common insulating or non conductive layer, wherein the at least one common further conductive layer is contact-connected via plated-through holes extending through the common insulating or non-conductive layer to conductive layers or devices or components integrated in the printed circuit board regions connected to one another;
   wherein at least one mutually complementary coupling element is each formed on mutually adjoining lateral surfaces of the printed circuit board regions to be connected to one another, via which coupling element coupling or connecting to the respectively adjoining printed circuit board region is effected.

2. The method according to claim 1, wherein, after having connected or coupled printed circuit board regions to be connected to one another and after having arranged or applied at least one additional conducting or conductive layer or ply, the structuring or patterning of conducting or conductive layers of the printed circuit boards and/or the mounting of additional electronic components or devices on the printed circuit board is/are effected.

3. The method according to claim 1, wherein an electrical connection of electrically conducting or conductive regions or elements of the printed circuit board regions to be connected to one another and/or layers of additional plies or additional elements is formed by soldering, gluing, welding, riveting or pinning, by vias or passages, conductively made bores, conductive pastes, conductive foils or wires, electronic devices or components or optical connections.

4. The method according to claim 1, wherein coupling or connecting of the printed circuit board regions to be connected to one another is effected by gluing, press-fitting, laminating, bonding, welding, soldering, a galvanic connection and/or by arranging or fixing components of the printed circuit board.

5. The method according to claim 1, wherein mutually complementary coupling elements are positively connected to each other.

6. The method according to claim 1, wherein mutually adjoining lateral surfaces of printed circuit board regions to be connected to one another are formed with mutually complementary profilings, particularly in the form of stepped and/or through-going recesses or depressions.

7. The method according to claim 1, wherein recesses or depressions for receiving printed circuit board regions extend over several layers or plies of multilayer printed circuit board regions.

8. The method according to claim 1, wherein the printed circuit board regions to be connected to one another are formed by flexible, rigid, rigid-flexible or semi flexible printed circuit board regions and/or high-frequency, HDI, substrate or ceramic printed circuit board regions.

9. The method according to claim 1, wherein a flexible printed circuit board region with at least one adjoining transition region is cut out of a carrier element comprising a plurality of the flexible printed circuit board regions and is inserted in a respective recess of a carrier element likewise comprising a plurality of rigid printed circuit board regions for the coupling or connection with at least one rigid printed circuit board region to be connected thereto of the plurality of the rigid printed circuit board regions.

* * * * *